US008653859B2

(12) United States Patent
Greenwood

(10) Patent No.: US 8,653,859 B2
(45) Date of Patent: Feb. 18, 2014

(54) ELECTRONIC COMPARISON CIRCUIT

(75) Inventor: Stephen F. Greenwood, Fort Collins, CO (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 228 days.

(21) Appl. No.: 13/192,341

(22) Filed: Jul. 27, 2011

(65) Prior Publication Data

US 2013/0027124 A1 Jan. 31, 2013

(51) Int. Cl.
*H03K 5/22* (2006.01)

(52) U.S. Cl.
USPC ................................................ 327/65; 327/52

(58) Field of Classification Search
USPC ................................................ 327/65, 50–56
See application file for complete search history.

(56) References Cited

U.S. PATENT DOCUMENTS 4,626,713 A * 12/1986 Lee ................................ 327/328
7,852,123 B1 * 12/2010 Cho et al. ......................... 327/74
8,258,816 B2 * 9/2012 Forbes ............................. 327/65
2006/0066393 A1 * 3/2006 Davis et al. .................... 327/563

* cited by examiner

*Primary Examiner* — Hai L Nguyen
(74) *Attorney, Agent, or Firm* — Park, Vaughan, Fleming & Dowler LLP

(57) ABSTRACT

An electronic circuit includes a differential input section, a current mirror section, an operational amplifier, an inverter, and a compensation voltage generator. The differential input section and the current mirror section are coupled together, forming a first common drain node and a second common drain node. The current mirror section has two p-type transistors coupled together at a common gate node. The operational amplifier has a positive input coupled to the first common drain node, a negative input coupled to the compensation voltage generator, and an output coupled to the common gate node. The inverter has an input node coupled to the second common drain node. The compensation voltage generator provides a compensation voltage to replicate a switching threshold voltage of the inverter.

12 Claims, 3 Drawing Sheets

ELECTRONIC COMPARISON CIRCUIT

TECHNICAL FIELD

Embodiments of the subject matter described herein relate generally to electronic circuits. More particularly, embodiments of the subject matter relate to a comparison circuit having low systematic threshold error.

BACKGROUND

Electronic circuits are used in countless applications, systems, and devices for a variety of purposes. A comparison circuit, which is also known as a comparator, can be used to compare the magnitudes of two analog quantities (such as voltage or current) and to generate an output that indicates the result of the comparison. A comparison circuit can be used in a digital system or device to generate a logic low or logic high output based on the result of the comparison. For example, if a first input is higher than a second input by at least a threshold amount, then the output is generated to indicate a logic high value; otherwise, the output is generated to indicate a logic low value. In certain applications, the inputs to a comparison circuit represent a differential input signal. For such applications, systematic errors in the comparison threshold may arise when performing the conversion from a differential signal to a full-swing logic output signal.

The systematic threshold error associated with a practical comparison circuit is inversely proportional to the gain of certain parts of the circuit, i.e., the gain from the differential input to the input of the first digital logic gate in the comparison circuit. Moreover, the threshold error is directly proportional to the voltage (or current) imbalance at the conversion point from differential input to single-ended output. Thus, one approach for dealing with the systematic threshold error is to increase the direct current (DC) gain (i.e., the low frequency gain) between the differential input and the conversion point, until the threshold error is sufficiently low. Another technique for addressing the threshold error is to alter the threshold of the logic gate (e.g., an inverter) that receives the single-ended output signal. This technique helps to some extent, but it does not dynamically compensate and adjust over variations in process, power supply voltage, or temperature (PVT). Moreover, this approach tends to degrade the static noise margins of the output logic gate.

Accordingly, it is desirable to have an improved comparison circuit that efficiently and effectively compensates for systematic comparison threshold errors and otherwise addresses certain shortcomings of existing and known solutions. Furthermore, other desirable features and characteristics will become apparent from the subsequent detailed description and the appended claims, taken in conjunction with the accompanying drawings and the foregoing technical field and background.

BRIEF SUMMARY OF EMBODIMENTS

An exemplary embodiment of an electronic circuit includes a differential input section, a current mirror section coupled to the differential input section, an operational amplifier, a first inverter, and a compensation voltage generator. The differential input section has a first transistor having a first conductivity type and a second transistor having the first conductivity type. The first transistor has a first input node to receive a first input signal, and the second transistor has a second input node to receive a second input signal. The current mirror section is coupled to the differential input section, and it has a third transistor having a second conductivity type and a fourth transistor having the second conductivity type. The third transistor and the fourth transistor are coupled together at a common gate node. The operational amplifier has a positive amplifier input node coupled to the first transistor and to the third transistor, a negative amplifier input node, and an amplifier output node coupled to the common gate node. The first inverter has a first inverter input node coupled to the second transistor and to the fourth transistor. The compensation voltage generator is coupled to the negative amplifier input node, and is configured to provide a compensation voltage to replicate a switching threshold voltage of the first inverter.

An exemplary embodiment of an integrated circuit device is also provided. The integrated circuit device includes four transistors, an operational amplifier, an inverter, and a compensation voltage generator. The first transistor has a first conductivity type, and it has a first gate node for receiving a first input signal, a first drain node, and a first source node for a reference voltage. The second transistor has the first conductivity type, and it has a second gate node for receiving a second input signal, a second drain node, and a second source node for the reference voltage. The third transistor has a second conductivity type, and it has a third gate node, a third drain node connected to the second drain node to form a first common drain node for the electronic comparison circuit, and a third source node for a supply voltage. The fourth transistor has the second conductivity type, and it has a fourth gate node connected to the third gate node to form a common gate node for the electronic comparison circuit, a fourth drain node connected to the second drain node to form a second common drain node for the electronic comparison circuit, and a fourth source node for the supply voltage. The operational amplifier has a positive amplifier input node corresponding to the first common drain node, a negative amplifier input node, and an amplifier output node corresponding to the common gate node. The inverter has an inverter input node corresponding to the second common drain node, and it has an inverter output node to generate an output signal that indicates a comparison between the first input signal and the second input signal. The compensation voltage generator is coupled to the negative amplifier input node, and is configured to provide a replica of a switching threshold voltage of the inverter that compensates for PVT (Process, Voltage, Temperature) variation.

Also provided is an exemplary embodiment of an electronic comparison circuit. The circuit includes a differential input section having a first transistor having a first conductivity type and a second transistor having the first conductivity type. The first transistor has a first input node to receive a first input signal, and the second transistor has a second input node to receive a second input signal. The circuit also includes a current mirror section coupled to the differential input section to form a first circuit output node and a second circuit output node. The current mirror section has a third transistor having a second conductivity type and a fourth transistor having the second conductivity type, the third transistor and the fourth transistor coupled together at a common gate node. The circuit also includes an operational amplifier having a positive amplifier input node, a negative amplifier input node, and an amplifier output node corresponding to the common gate node. The circuit also includes a first inverter and a second inverter. The first inverter has an input node corresponding to the second circuit output node, and a first inverter output node to generate a first output signal for the electronic comparison circuit. The second inverter has a second inverter input node corresponding to the first circuit output node, and a second inverter output node to generate a second output signal for the electronic comparison circuit. The circuit also includes a first resistance element and a second resistance element. The first resistance element is coupled between the positive amplifier input node and the first circuit output node, and the second resistance element is coupled between the positive amplifier input node and the second circuit output node. The circuit also includes a compensation voltage generator coupled to the negative amplifier input node, and configured to provide a compensation voltage that compensates for PVT variation.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
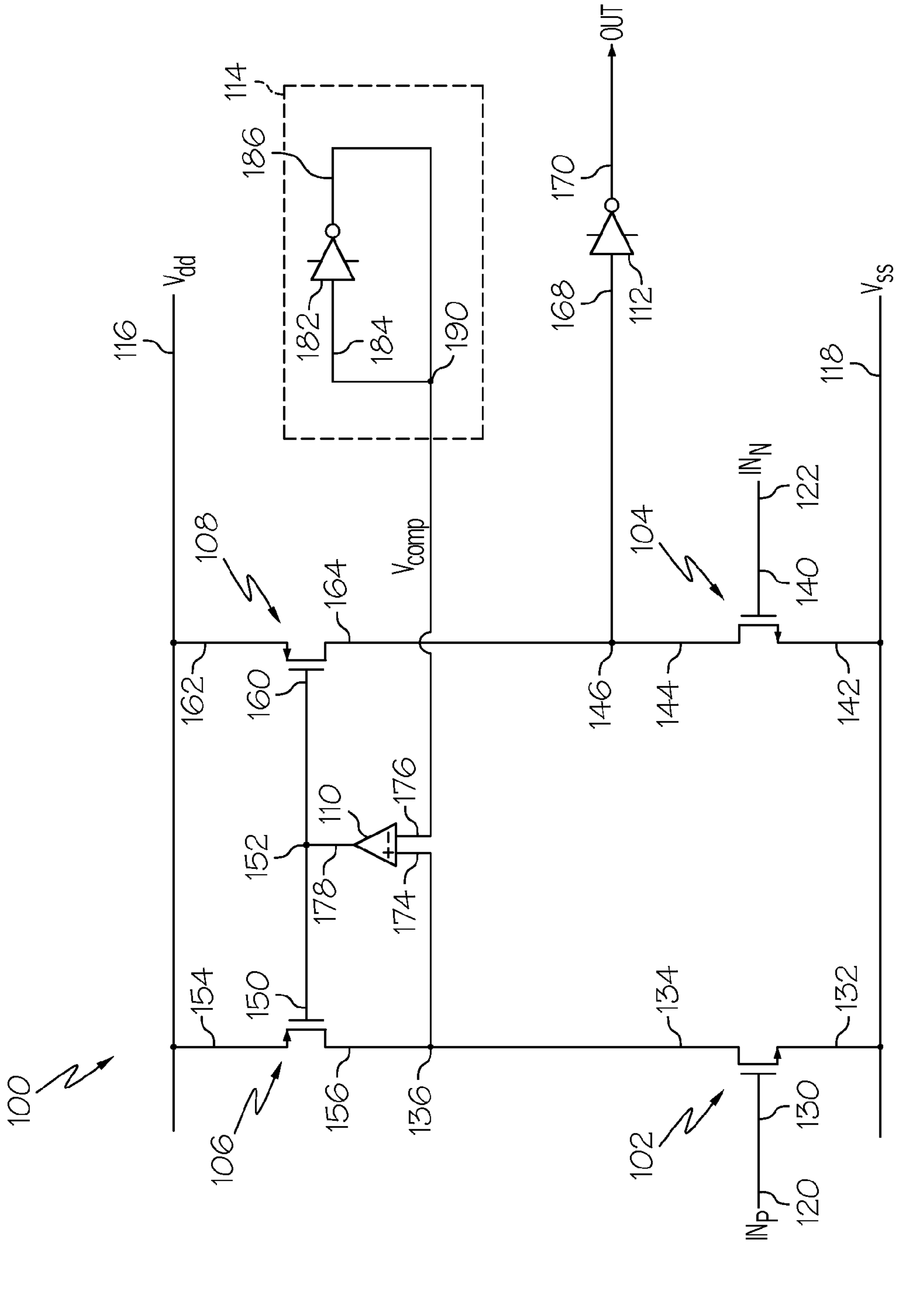
FIG. 1 is a schematic representation of an exemplary embodiment of an electronic comparison circuit.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The following description refers to elements or nodes or features being "connected" or "coupled" together. As used herein, unless expressly stated otherwise, "coupled" means that one element/node/feature is directly or indirectly joined to (or directly or indirectly communicates with) another element/node/feature, and not necessarily mechanically. Likewise, unless expressly stated otherwise, "connected" means that one element/node/feature is directly joined to (or directly communicates with) another element/node/feature, and not necessarily mechanically.

An electronic comparison circuit is presented here. The electronic comparison circuit may be implemented as an integrated circuit device, which in turn may include additional components, devices, circuits, or elements to cooperate with the electronic comparison circuit. For example, an integrated circuit based processor chip could be fabricated with one or more instantiations of the electronic comparison circuit.

The electronic comparison circuit utilizes an active current mirror to compensate for the systematic comparison threshold error, which may vary over different PVT conditions. A feedback loop senses the input current and dynamically adjusts the gate voltage of the current mirror to produce the desired output current (which might be scaled). The action of the feedback loop forces the drain voltage of the output logic device (typically an inverter) to a particular reference or compensation voltage. In certain embodiments, the input and output of the current mirror are driven by a differential input pair of transistors. In one implementation, the output of the current mirror drives a logic gate, the output of which is a single-ended, full-swing logic signal representing the polarity of the differential input. Ideally, the compensation voltage is chosen to be equal to the switching threshold of the output logic gate. But for the finite gain of the feedback loop, this configuration and approach eliminates the systematic threshold error in the comparison circuit.

FIG. 1 is a schematic representation of an exemplary embodiment of an electronic comparison circuit 100. Although the circuit schematic shown in FIG. 1 depicts one exemplary arrangement of elements that are directly connected together, additional intervening elements, devices, features, or components may be present in an embodiment of the depicted subject matter. This particular embodiment of the comparison circuit 100 is implemented with field effect transistors, namely, metal oxide semiconductor field effect transistors (MOSFETs). More specifically, the comparison circuit 100 uses a plurality of MOSFETs having a first conductivity type (e.g., n-type) and a plurality of MOSFETs having a second conductivity type (e.g., p-type), arranged in the topology depicted in FIG. 1. For convenience, n-type field effect transistors are referred to herein as NFETs, and p-type field effect transistors are referred to herein as PFETs, in accordance with well established convention. It should be appreciated that the conductivity type of the transistors could be switched in an alternate embodiment of the comparison circuit 100 without altering the functionality and operating features described herein.

The illustrated embodiment of the comparison circuit 100 includes, without limitation: a first transistor (the NFET 102); a second transistor (the NFET 104); a third transistor (the PFET 106); a fourth transistor (the PFET 108); an operational amplifier 110; a first output inverter 112; and a compensation voltage generator 114. The NFET 102 and the NFET 104 together form a differential input section for the comparison circuit 100. The PFET 106 and the PFET 108 together form a current mirror section for the comparison circuit 100. As depicted in FIG. 1, the current mirror section is coupled to the differential input section such that the sections can cooperate with each other in the manner described in more detail below.

It should be appreciated that the first output inverter 112 need not be considered to be a part of the comparison circuit 100. Rather, the first output inverter 112 may instead be realized as an element of any "downstream" circuit, device, or component to which the comparison circuit 100 is coupled.

The comparison circuit 100 also includes or cooperates with a supply voltage node 116 (labeled Vdd for convenience); a reference voltage node 118 (labeled Vss for convenience); a first input node 120 for receiving a first input signal (labeled $IN_P$ for convenience); and a second input node 122 for receiving a second input signal (labeled $IN_N$ for convenience). In operation, a supply voltage (such as Vdd) can be established or otherwise maintained across the supply voltage node 116 and the reference voltage node 118, which is typically, but not always, grounded. In certain applications, the first input node 120 receives the first component (e.g., the positive or non-inverted component) of a differential input signal, and the second input node 122 receives the second component (e.g., the negative or complementary component) of the differential input signal.

The gate node 130 of the NFET 102 corresponds to the first input node 120, as shown in FIG. 1. Thus, the gate node 130 receives the first input signal ($IN_P$). The source node 132 of the NFET 102 is coupled to the reference voltage node 118, and the drain node 134 of the NFET 102 is coupled to a first common drain node 136 (also referred to herein as the first circuit output node) of the comparison circuit 100. The gate node 140 of the NFET 104 corresponds to the second input node 122, as shown in FIG. 1. Thus, the gate node 140 receives the second input signal ($IN_N$). The source node 142 of the NFET 104 is coupled to the reference voltage node 118, and the drain node 144 of the NFET 104 is coupled to a second common drain node 146 (also referred to herein as the second circuit output node) of the comparison circuit 100.

The gate node 150 of the PFET 106 is coupled to a common gate node 152 of the comparison circuit 100. The source node 154 of the PFET 106 is coupled to the supply voltage node 116, and the drain node 156 of the PFET 106 is coupled to the first common drain node 136. The gate node 160 of the PFET 108 is coupled to the common gate node 152, the source node 162 of the PFET 108 is coupled to the supply voltage node 116, and the drain node 164 of the PFET 108 is coupled to the second common drain node 146. For this particular embodiment, the input node 168 of the first output inverter 112 is coupled to the second common drain node 146. Accordingly, the input node 168 is coupled to the NFET 104 and to the PFET 108. The output node 170 of the first output inverter 112 may be coupled to one or more "downstream" elements, components, or circuits as needed or desired.

The operational amplifier 110 has a positive amplifier input node 174, a negative amplifier input node 176, and an amplifier output node 178. The positive amplifier input node 174 is coupled to the NFET 102 and to the PFET 106 by way of the first common drain node 136. The negative amplifier input node 176 is coupled to the compensation voltage generator 114, and the amplifier output node 178 is coupled to the common gate node 152. As described in more detail below, the compensation voltage generator 114 is configured to provide a compensation voltage (labeled $V_{COMP}$) at the negative amplifier input node 176 to compensate for the switching threshold of the first output inverter 112. In practice, this compensation voltage compensates for PVT variation of the first output inverter 112. Although not always required, the exemplary embodiment of the compensation voltage generator 114 is realized as a replica inverter 182 having its input node 184 and its output node 186 coupled to the negative amplifier input node 176. The replica inverter 182 and the first output inverter 112 have nominally matched electrical characteristics such that the switching threshold and other PVT-influenced operating parameters of the first output inverter 112 are accurately and precisely replicated by the replica inverter 182.

It should be appreciated that the illustrated implementation has certain direct connections and shared nodes, which are apparent from FIG. 1. For example, the amplifier output node 178, the gate node 150, and the gate node 160 are all directly connected together, and they correspond to (and create) the common gate node 152. As another example, the positive amplifier input node 174, the drain node 134, and the drain node 156 are all directly connected together, and they correspond to (and form) the first common drain node 136. Similarly, the drain node 144, the drain node 164, and the inverter input node 168 correspond to (and form) the second common drain node 146. Moreover, the negative amplifier input node 176, the replica inverter input node 184, and the replica inverter output node 186 are all directly connected together, and they correspond to (and form) a common node 190 at which the compensation voltage is present.

During operation, the operational amplifier 110 and the compensation voltage generator 114 cooperate to force the voltage present at the first common drain node 136 to be equal to the voltage present at the second common drain node 146, regardless of PVT variations. In other words, the voltage at the first common drain node 136 is ideally equal to the threshold/switching voltage of the first output inverter 112. This, in turn, makes the differential input section (i.e., the NFETs 102, 104) symmetric and enables the comparison circuit 100 to function in a consistent and predictable manner by reducing or eliminating the systematic error that is normally associated with channel-length modulation in FETs 102, 104, 106, 108, as well as PVT variation. Moreover, the comparison circuit 100 can tolerate variation of the voltage at the common gate node 152 as needed to achieve the symmetric condition described above. Consequently, the comparison circuit 100 can tolerate some fluctuation in the supply voltage, which is desirable in certain applications. In this regard, it may be desirable to implement a compensation circuit, element, or device (such as a transistor or a capacitor between the amplifier output node 178 and the supply voltage node 116) for additional stability, power supply noise rejection, etc.

For this particular embodiment, the second common drain node 146 may be considered to be the comparison output node for the comparison circuit 100. In this regard, the voltage at the second common drain node 146 will indicate a logic high level or a logic low level, depending upon the magnitudes of the first and second input signals ($IN_P$ and $IN_N$). In response to this voltage, the first output inverter 112 generates a full-swing single-ended output signal (labeled OUT) at its output node 170. This output signal can then be utilized as so desired. For example, any number of additional inverters could be added to the output path for buffering, gain, or signal conditioning.

As mentioned above, the replica inverter 182 is one suitable implementation of the compensation voltage generator 114. The replica inverter 182, however, has its output node 186 shorted to its input node 184. In a practical embodiment, this arrangement can be wasteful of power. In this regard, the circuit topology of the replica inverter 182 will result in the transistors of the replica inverter 182 being maintained in a perpetual "on" state. Accordingly, it may be desirable to implement the replica inverter 182 as a power up-down inverter that can be enabled and disabled using one or more control signals (the vertical lines extending from the schematic symbol for the replica inverter 182 represent the enable/disable functionality). Thus, the replica inverter 182 can be selectively enabled and disabled to better manage the overall power consumption of the comparison circuit 100. Notably, the first output inverter 112 is also be realized as a power up-down inverter such that the replica inverter 182 can accurately and precisely replicate the first output inverter 112.

Figure 2:
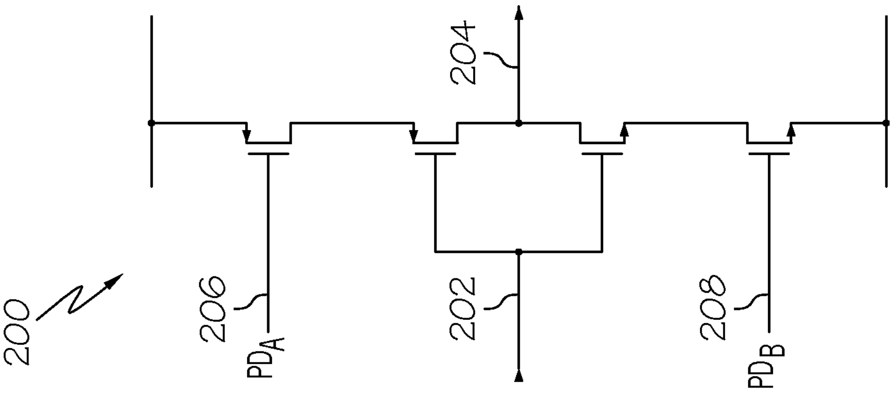
FIG. 2 is a schematic representation of an exemplary embodiment of a power up-down inverter suitable for use in the electronic comparison circuit shown in FIG. 1.

FIG. 2 is a schematic representation of an exemplary embodiment of a power up-down inverter 200 suitable for use in the comparison circuit 100. The power up-down inverter 200 has an input node 202, an output node 204, and two enable/disable nodes 206, 208. The enable/disable signals (labeled $PD_A$ and $PD_B$) are controlled to selectively power up and power down the transistors in the power up-down inverter 200, as is well understood. The power up-down inverter 200 can be utilized as the replica inverter 182 (see FIG. 1) by shorting the output node 204 to the input node 202.

Figure 3:
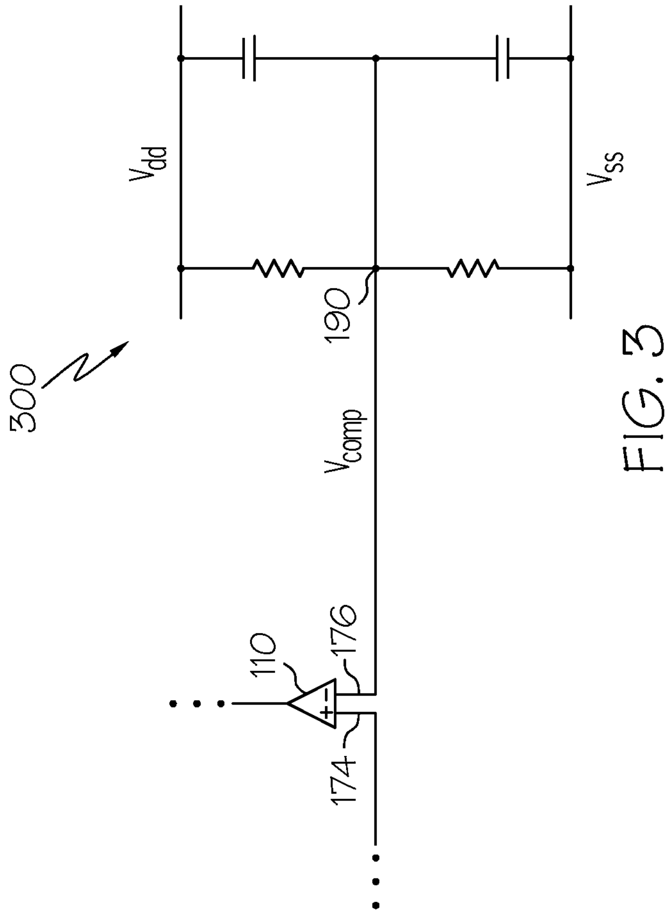
FIG. 3 is a schematic representation of an exemplary embodiment of a voltage divider, which could be used in lieu of the replica inverter of the electronic comparison circuit shown in FIG. 1.

If further power saving is desired, then the compensation voltage generator 114 could be realized as a voltage divider (or as any stable voltage source that provides a specific voltage rather than one that automatically adjusts to variations in PVT) instead of a replica inverter. In this regard, FIG. 3 is a schematic representation of an exemplary embodiment of a voltage divider 300, which could be used in lieu of the replica inverter 182. The resistance values of the voltage divider 300 are selected to establish a specified fraction of the supply voltage at the common node 190. Although the voltage divider 300 results in an improvement over conventional comparison circuit designs, the power savings comes at the cost of inferior threshold voltage offset compensation because the voltage divider 300 does not compensate for PVT variation. For this reason, the arrangement depicted in FIG. 1 will usually be preferred.

The compensation voltage generator 114 may alternatively leverage a hybrid approach that combines the accuracy benefits of the replication approach with the power savings of the voltage divider approach. This hybrid approach could employ a pseudo-replica logic gate with its input(s) and output short-circuited. The pseudo-replica gate would use larger channel lengths to reduce power dissipation. Although a pseudo-replica gate may not be a precise replica of the first output inverter 112, it will result in at least partial cancellation of the systematic errors caused by PVT variation.

Figure 4:
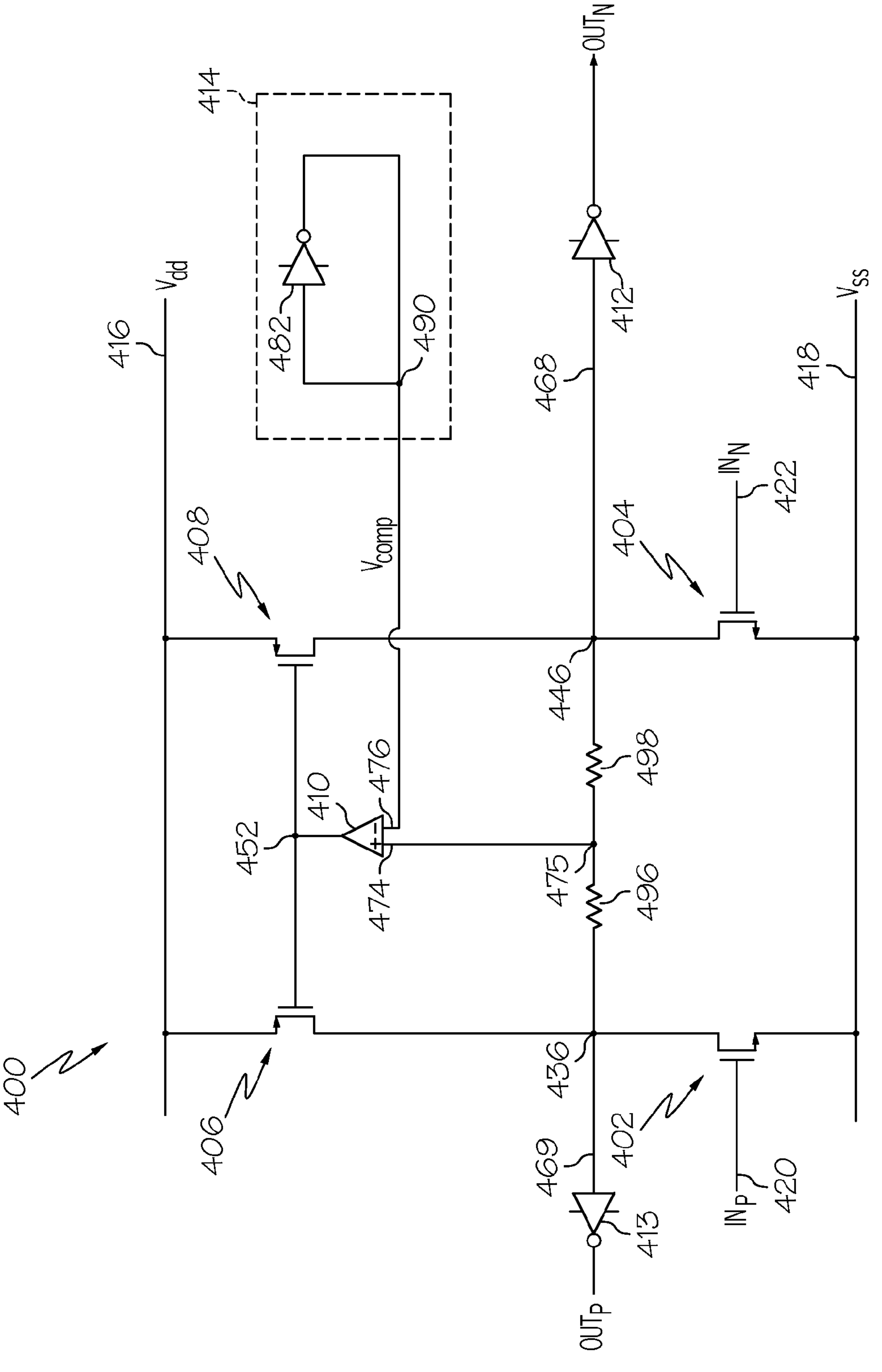
FIG. 4 is a schematic representation of another exemplary embodiment of an electronic comparison circuit.

The embodiment of the comparison circuit 100 described above produces a single-ended output signal. In various applications, however, it may be desirable to generate a complementary output signal. In this regard, FIG. 4 is a schematic representation of another exemplary embodiment of an electronic comparison circuit 400. The comparison circuit 400 is similar in many respects to the comparison circuit 100, and certain features, elements, and characteristics are shared between the two comparison circuits 100, 400. For the sake of brevity and clarity, common features and aspects will not be redundantly described in detail here.

The comparison circuit 400 generally includes, without limitation: a first transistor (the NFET 402); a second transistor (the NFET 404); a third transistor (the PFET 406); a fourth transistor (the PFET 408); an operational amplifier 410; a first output inverter 412; a second output inverter 413; and a compensation voltage generator 414. Other than the second output inverter 413, the elements of the comparison circuit 400 are coupled together as described above for the comparison circuit 100. The comparison circuit 400 also includes or cooperates with a supply voltage node 416 (labeled Vdd for convenience); a reference voltage node 418 (labeled Vss for convenience); a first input node 420 for receiving a first input signal ($IN_P$); and a second input node 422 for receiving a second input signal ($IN_N$).

The comparison circuit 400 has a first common drain node 436, a second common drain node 446, and a common gate node 452, each having respective counterparts in the comparison circuit 100. For this embodiment, the input node 468 of the first output inverter 412 is coupled to the second common drain node 446, and the input node 469 of the second output inverter 413 is coupled to the first common drain node 436. Accordingly, the input node 469 is coupled to the NFET 402 and to the PFET 406.

The negative amplifier input node 476 of the operational amplifier 410 is coupled to the compensation voltage generator 414, as described above for the comparison circuit 100. In contrast to the comparison circuit 100, however, the positive amplifier input node 474 of the operational amplifier 410 is coupled to a common resistance node 475 of the comparison circuit 400. Two resistance elements (e.g., resistors) are also coupled to the common resistance node 475. More specifically, a first resistance element 496 is coupled between the first common drain node 436 and the common resistance node 475, and a second resistance element 498 is coupled between the second common drain node 446 and the common resistance node 475. For the illustrated embodiment, the first common drain node 436 corresponds to the drain node of the NFET 402, the drain node of the PFET 406, the input node 469 of the second output inverter 413, and a first end of the resistance element 496. Similarly, the second common drain node 446 corresponds to the drain node of the NFET 404, the drain node of the PFET 408, the input node 468 of the first output inverter 412, and a first end of the resistance element 498. For this exemplary arrangement, the second end of the resistance element 496 and the second end of the resistance element 498 are directly connected to (and correspond to) the positive amplifier input node 474. For reasons explained below, the resistance elements 496, 498 have nominally matched resistance characteristics. In other words, the resistance elements 496, 498 have the same resistance. In practice, the resistance is relatively large compared to the drain-source transistor resistance. For example, the resistance of the resistance elements 496, 498 may be in the tens of kilohms in certain practical embodiments.

As described above, the compensation voltage generator 414 is configured to provide a compensation voltage ($V_{COMP}$) at the negative amplifier input node 476 to compensate for the switching thresholds of the output inverters 412, 413. For the illustrated embodiment (which employs a replica inverter 482 having its input node coupled to its output node), the replica inverter 482, the first output inverter 412, and the second output inverter 413 have nominally matched electrical characteristics such that the switching thresholds and other PVT-influenced operating parameters of the output inverters 412, 413 are accurately and precisely replicated by the replica inverter 482.

The second common drain node 446 may be considered to be one comparison output node for the comparison circuit 400, and the first common drain node 436 may be considered to be the other comparison output node for the comparison circuit 400. The first output inverter 412 generates a first component of a complementary output signal (e.g., the negative or inverted output), and the second output inverter 413 generates a second component of the complementary output signal (e.g., the positive or non-inverted output). Notably, this complementary output signal indicates or otherwise represents the result of the comparison between the two input signals ($IN_P$ and $IN_N$). To this end, the resistance elements 496, 498 function as a voltage divider such that the voltage present at the common resistance node 475 will be the average of the voltages present at the common drain nodes 436, 446. The operational amplifier 410 forces this average voltage to be equal to $V_{COMP}$. Consequently, the outputs of both output inverters 412, 413 are desensitized to the threshold error, in the manner described above for the comparison circuit 100.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. An electronic circuit comprising:

a differential input section comprising a first transistor having a first conductivity type and a second transistor having the first conductivity type, the first transistor having a first input node to receive a first input signal, and the second transistor having a second input node to receive a second input signal;

a current mirror section coupled to the differential input section, the current mirror section comprising a third transistor having a second conductivity type and a fourth transistor having the second conductivity type, the third transistor and the fourth transistor coupled together at a common gate node;

an operational amplifier having a positive amplifier input node connected to the first transistor and to the third transistor, a negative amplifier input node, and an amplifier output node coupled to the common gate node;

a first inverter having a first inverter input node coupled to the second transistor and to the fourth transistor; and a compensation voltage generator coupled to the negative amplifier input node, and configured to provide a compensation voltage to replicate a switching threshold voltage of the first inverter.

2. The electronic circuit of claim 1, the compensation voltage generator comprising a replica inverter having a replica inverter input node coupled to the negative amplifier input node, and a replica inverter output node coupled to the negative amplifier input node, wherein the first inverter and the replica inverter have nominally matched electrical characteristics.

3. The electronic circuit of claim 1, wherein:

the first conductivity type is n-type; and the second conductivity type is p-type.

4. The electronic circuit of claim 3, wherein:

the first transistor is an n-type field effect transistor (NFET) having a first gate node, a first drain node, and a first source node, the first gate node corresponding to the first input node, and the first source node coupled to a reference voltage; and the second transistor is an NFET having a second gate node, a second drain node, and a second source node, the second gate node corresponding to the second input node, and the second source node coupled to the reference voltage.

5. The electronic circuit of claim 4, wherein:

the third transistor is a p-type field effect transistor (PFET) having a third gate node, a third drain node, and a third source node, the third gate node corresponding to the common gate node, the third drain node coupled to the first drain node, and the third source node coupled to a supply voltage; and the fourth transistor is a PFET having a fourth gate node, a fourth drain node, and a fourth source node, the fourth gate node corresponding to the common gate node, the fourth drain node coupled to the second drain node, and the fourth source node coupled to the supply voltage.

6. The electronic circuit of claim 1, wherein:

the second transistor is an n-type field effect transistor (NFET) having a second gate node, a second drain node, and a second source node, the second gate node corresponding to the second input node, and the second source node coupled to a reference voltage;

the fourth transistor is a p-type field effect transistor (PFET) having a fourth gate node, a fourth drain node, and a fourth source node, the fourth gate node corresponding to the common gate node, the fourth drain node connected to the second drain node to form a common drain node, and the fourth source node coupled to a supply voltage; and the first inverter input node is coupled to the common drain node.

7. The electronic circuit of claim 1, wherein:

the first transistor is an n-type field effect transistor (NFET) having a first gate node, a first drain node, and a first source node, the first gate node corresponding to the first input node, and the first source node coupled to a reference voltage;

the third transistor is a p-type field effect transistor (PFET) having a third gate node, a third drain node, and a third source node, the third gate node corresponding to the common gate node, the third drain node connected to the first drain node to form a common drain node, and the third source node coupled to a supply voltage; and the positive amplifier input node is directly connected to the common drain node.

8. The electronic circuit of claim 1, wherein the first inverter has a first inverter output node to generate a first output signal for the electronic circuit, the first output signal indicating a comparison between the first input signal and the second input signal.

9. An integrated circuit device comprising:

a first transistor of a first conductivity type, and having a first gate node for receiving a first input signal, a first drain node, and a first source node for a reference voltage;

a second transistor of the first conductivity type, and having a second gate node for receiving a second input signal, a second drain node, and a second source node for the reference voltage;

a third transistor of a second conductivity type, and having a third gate node, a third drain node connected to the first drain node to form a first common drain node for the electronic comparison circuit, and a third source node for a supply voltage;

a fourth transistor of the second conductivity type, and having a fourth gate node connected to the third gate node to form a common gate node for the electronic comparison circuit, a fourth drain node connected to the second drain node to form a second common drain node for the electronic comparison circuit, and a fourth source node for the supply voltage;

an operational amplifier having a positive amplifier input node connected to the first common drain node, a negative amplifier input node, and an amplifier output node corresponding to the common gate node;

an inverter having an inverter input node corresponding to the second common drain node, and having an inverter output node to generate an output signal that indicates a comparison between the first input signal and the second input signal; and a compensation voltage generator coupled to the negative amplifier input node, and configured to provide a replica of a switching threshold voltage of the inverter that compensates for PVT (Process, Voltage, Temperature) variation.

10. The integrated circuit device of claim 9, the compensation voltage generator comprising a replica inverter having a replica inverter input node coupled to the negative amplifier input node, and a replica inverter output node coupled to the negative amplifier input node, wherein the inverter and the replica inverter have nominally matched electrical characteristics.

11. The integrated circuit device of claim 10, wherein the replica inverter input node and the replica inverter output node are directly connected to the negative amplifier input node.

12. The integrated circuit device of claim 9, the compensation voltage generator comprising a voltage divider.

* * * * *